(12) United States Patent
Hung et al.

(10) Patent No.: US 10,396,774 B2
(45) Date of Patent: Aug. 27, 2019

(54) INTELLIGENT POWER MODULE OPERABLE TO BE DRIVEN BY NEGATIVE GATE VOLTAGE

(71) Applicant: Hestia Power Inc., Hsinchu (TW)

(72) Inventors: Chien-Chung Hung, Hsinchu (TW);
Fu-Jen Hsu, Hsinchu (TW);
Cheng-Tyng Yen, Hsinchu (TW);
Chwan-Ying Lee, Hsinchu (TW)

(73) Assignee: Hestia Power Inc., Hsinchu (TW)

( * ) Notice: Subject to any disclaimer, the term of this patent is extended or adjusted under 35 U.S.C. 154(b) by 0 days.

(21) Appl. No.: 15/704,546

(22) Filed: Sep. 14, 2017

(65) Prior Publication Data

US 2019/0181849 A1 Jun. 13, 2019

(51) Int. Cl.
*H03K 3/00* (2006.01)
*H03K 17/08* (2006.01)
*H03K 17/567* (2006.01)
*H03K 17/687* (2006.01)

(52) U.S. Cl.
CPC .......... *H03K 17/08* (2013.01); *H03K 17/567* (2013.01); *H03K 17/687* (2013.01)

(58) Field of Classification Search
CPC ..... H03K 17/08; H03K 17/687; H03K 17/567
See application file for complete search history.

(56) References Cited

U.S. PATENT DOCUMENTS

| | | | |
|---|---|---|---|
| 7,411,768 B2 * | 8/2008 | Sells | H02H 7/1255 307/127 |
| 8,614,874 B2 * | 12/2013 | Sells | H02M 7/219 361/246 |
| 9,252,028 B2 | 2/2016 | Shiramizu et al. | |
| 9,530,724 B2 | 12/2016 | Fernando et al. | |
| 2013/0127500 A1 * | 5/2013 | Kobayashi | H03K 17/0822 327/109 |

* cited by examiner

*Primary Examiner* — Kenneth B Wells
(74) *Attorney, Agent, or Firm* — Muncy, Geissler, Olds & Lowe, P.C.

(57) ABSTRACT

An intelligent power component module operable to be driven by a negative gate voltage integrates a wide bandgap semiconductor power unit, an adjustment unit and a driving unit so as to adjust a voltage level of the driving unit by the adjustment unit. Accordingly, the wide bandgap semiconductor power unit, in a driven state, comprises a driving voltage level alternating between a positive and a negative voltage.

12 Claims, 7 Drawing Sheets

INTELLIGENT POWER MODULE OPERABLE TO BE DRIVEN BY NEGATIVE GATE VOLTAGE

FIELD OF THE INVENTION

The present invention relates to a power module for energy conversion, and particularly to a silicon carbide (SiC) intelligent power module operable to be driven by a negative gate voltage.

BACKGROUND OF THE INVENTION

An intelligent power module (IPM) is a power switch device integrating a transistor and an associated driving circuit, and features high voltage, high input impedance, high switching frequency and low driving power. Further, in an intelligent power module, a malfunction detection circuit for detecting undercurrent, overcurrent, short circuit and overheating is provided, hence significantly enhancing system reliability. Intelligent power modules are currently extensively applied in the fields of inverter household appliances, inverter power supplies and industrial control, offering sizable economic benefits.

Therefore, manufacturers make improvements on the structure and circuit designs of intelligent power modules to reinforce the integration of components, reduce routing wires or lower assembly complications, in aim of satisfying consumer needs by such performance enhancement and size and weight reduction.

For example, the U.S. Pat. No. 9,530,724B2 discloses a PQFN semiconductor package, in which a driver integrated circuit and a leadframe are coupled, and a plurality of vertical conduction power devices are coupled to the leadframe. The PQFN semiconductor package further includes a plurality of wirebonds providing electrical interconnections, wherein at least one wirebond connects from an upper surface of one of the vertical conduction power devices to a part of the leadframe, such that a part of the connected leadframe is electrically connected to an electrode at a lower surface of the plurality of vertical conduction power devices. Accordingly, effective circuit interconnections can be provided in the PQFN package by a low-cost leadframe.

Further, the U.S. Pat. No. 9,252,028B2 discloses a power semiconductor module integrating a gate driver chip and a power module. The above power semiconductor module includes a first frame portion and a second frame portion. The first frame portion comprises a first surface and a second surface that are opposite, and power semiconductor elements, such as an insulated gate bipolar transistor (IGBT) and a freewheeling diode (FWD), are disposed on the first surface. The second frame portion comprises a third surface and a fourth surface that are opposite, and includes a control integrated circuit, a wire and an insulator portion. The control integrated circuit is disposed on the third surface. The power semiconductor element and the control integrated circuit are connected by the wire, and the power semiconductor element, the first frame portion, the control integrated circuit, the second frame portion and the wire are packaged by the insulator portion. As such, the first surface of the first frame portion and the third surface of the second frame portion are located at the same height in a direction vertical to the first surface of the first frame portion. Using the above structure, the stability of the wire is increased to prevent disconnection of the wire or a short circuit, thereby obtaining a power semiconductor module with better reliability.

SUMMARY OF THE INVENTION

It is a primary object of the present invention to solve issues of a conventional intelligent power module. Particularly, when a silicon carbide (SiC) wide bandgap semiconductor power unit is used in a conventional intelligent power module, a positive bias threshold and a negative bias threshold of the module become unstable due to defects at an interface of the SiC wide bandgap semiconductor unit.

It is another object of the present invention to solve an issue of production cost of a conventional intelligent power module caused by a gate driver exclusively developed for coordinating with a wide SiC wide bandgap semiconductor power unit used in the conventional intelligent power module.

To achieve the above objects, the present invention provides an intelligent power component module operable to be driven by a negative gate voltage. The intelligent power component module includes: an upper bridge circuit, including a first driving unit, and a first wide bandgap semiconductor power unit electrically connected to the first driving unit, the first wide bandgap semiconductor power unit having a first drain terminal, a first gate terminal and a first source terminal; a lower bridge circuit, including a second driving unit, and a second wide bandgap semiconductor power unit electrically connected to the second driving unit, the second wide bandgap semiconductor power unit having a second drain terminal electrically connected to the first source terminal of the first wide bandgap semiconductor power unit, a second gate terminal and a second source terminal; a first adjustment unit, including a first resistor electrically connected to the first driving unit and a first Zener diode electrically connected to the first resistor, the first Zener diode further electrically connected to a first output node between the first source terminal of the first wide bandgap semiconductor power unit and the second drain terminal of the second wide bandgap semiconductor power unit, and a first high side of the first driving unit; and a second adjustment unit, including a second resistor electrically connected to the second driving unit and a second Zener diode, the second Zener diode electrically connected to the second source terminal of the second wide bandgap semiconductor power unit and a first low side of the second driving unit.

In one embodiment of the present invention, the first adjustment unit is electrically connected to a high-side ground terminal and a high-side power terminal of the first driving unit, and the second adjustment unit is electrically connected to a low-side ground terminal and a low-side power terminal of the second driving unit. More specifically, the first Zener diode comprises its negative terminal electrically connected to the first output node, and its positive terminal electrically connected to the high-side ground terminal; the second Zener diode comprises its negative terminal electrically connected to a first ground terminal, and its positive terminal electrically connected to the low-side ground terminal. Accordingly, respective voltage levels of the first driving unit and the second driving unit are provided with shift voltages respectively by the first adjustment unit and the second adjustment unit and can be adjusted, such that the first wide bandgap semiconductor power unit and the second wide bandgap semiconductor power unit, in a driven state, each comprises a gate driving voltage level alternating between a positive voltage and a negative voltage. Therefore, compared to the prior art, the present invention achieves following effects.

1. The intelligent power component module of the present invention is an intelligent power component module operable to be driven by a negative gate voltage, hence overcomes the issue that a positive bias threshold and a negative bias threshold of the module become unstable due to defects at an interface of a SiC wide bandgap semiconductor unit when the SiC wide bandgap semiconductor power unit is used in a conventional intelligent power module, thereby enhancing the reliability of the intelligent power component module.

2. The intelligent power component module of the present invention is applicable in coordination with a common gate driver for silicon insulated gate bipolar transistor (IGBT) rather than needing an exclusive gate driver, thereby significantly reducing production costs of the intelligent power component module to promote industrial application.

3. In the intelligent power component module of the present invention, components are internally connected and integrated in one single package structure. Thus, with respect to the external of the intelligent power component module, pin-to-pin compatibility is provided to allow the intelligent power component module of the present invention to be extensively applied to replace other conventional intelligent power component module products.

DETAILED DESCRIPTION OF THE PREFERRED EMBODIMENTS

Details and technical contents of the present invention are given with the accompanying drawings below.

Figure 1A:
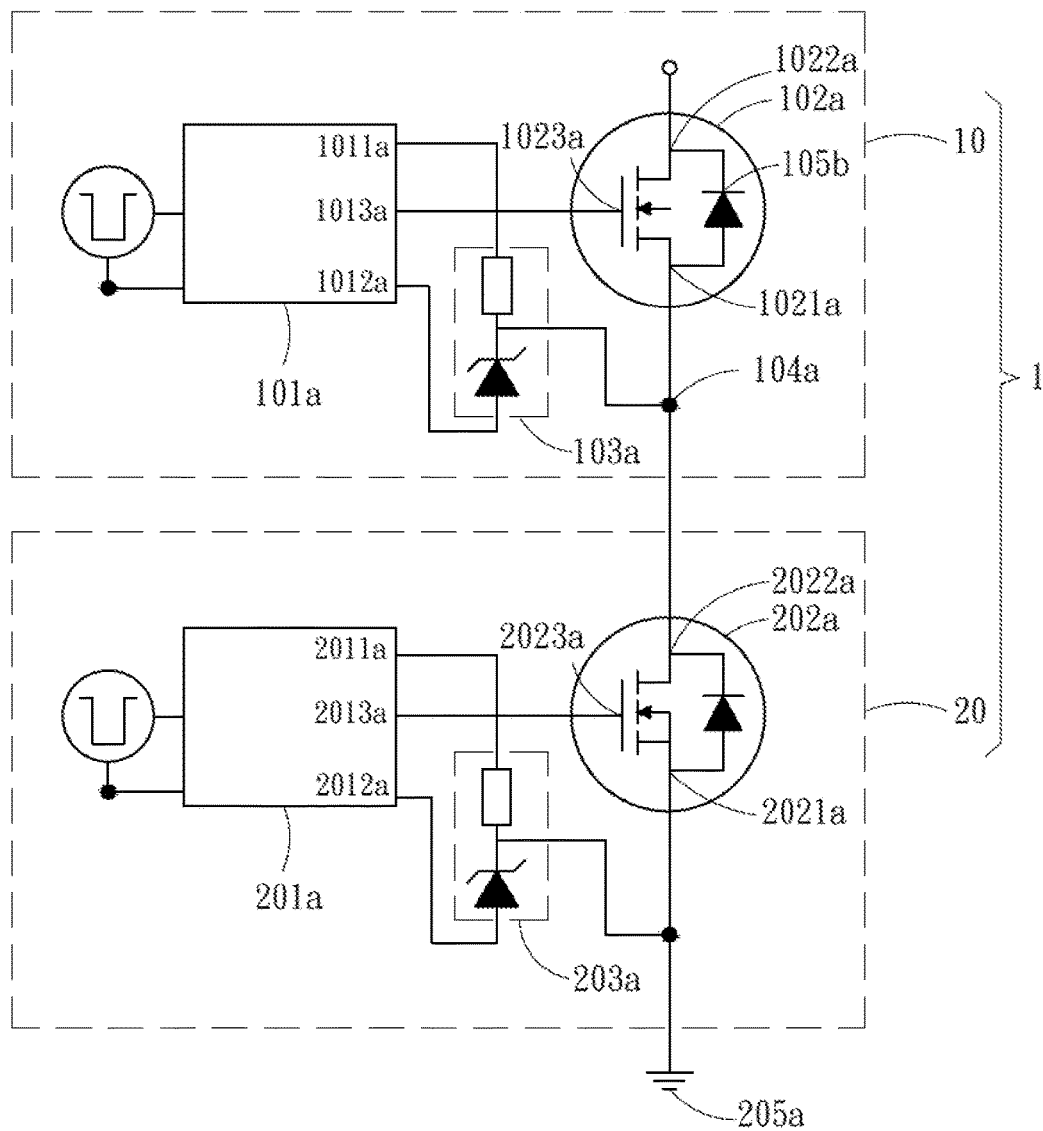
FIG. 1A is a schematic diagram of an intelligent power component module operable to be driven by a negative gate voltage according to an embodiment of the present invention.

FIG. 1A shows a schematic diagram of an intelligent power component module 1 operable to be driven by a negative gate voltage according to an embodiment of the present invention. The intelligent power component module 1 mainly includes an upper bridge circuit 10 and a lower bridge circuit 20.

The upper bridge circuit 10 includes a first driving unit 101a and a first wide bandgap semiconductor power unit 102a. The first wide bandgap semiconductor power unit 102a comprises a first source terminal 1021a, a first drain terminal 1022a and a first gate terminal 1023a. The first wide bandgap 102a is electrically connected, via the first gate terminal 1023a, to a high-side output control terminal 1013a of the first driving unit 101a, in a way that the first driving unit 101a can output high and low control signals to the first gate terminal 1023a.

The lower bridge circuit 20 includes a second driving unit 201a and a second wide bandgap semiconductor power unit 202a. The second wide bandgap semiconductor power unit 202a is electrically connected to the second driving unit 201a, and comprises a second drain terminal 2022a electrically connected to the first source terminal 1021a of the first wide bandgap semiconductor power unit 102a, a second gate terminal 2023a and a second source terminal 2021a. The second gate terminal 2023a is connected to a low-side output control terminal 2013a of the second driving unit 201a.

Figure 1B:
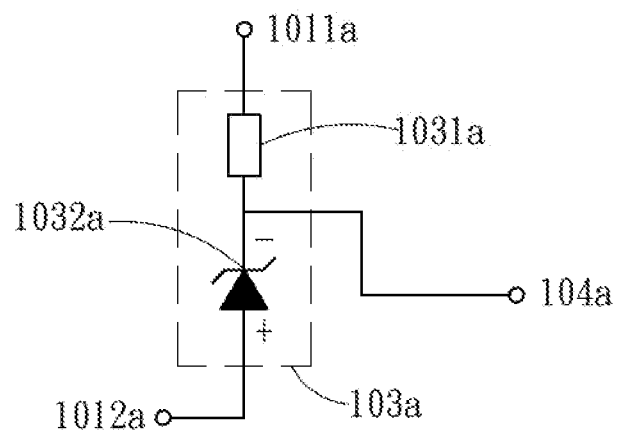
FIG. 1B is an enlarged schematic diagram of the first adjustment unit in FIG. 1A.

A first adjustment unit 103a is disposed between the first driving unit 101a and the first wide bandgap semiconductor power unit 102a. The first adjustment unit 103a is electrically connected to a first output node 104a between the first source terminal 1021a of the first wide bandgap semiconductor power unit 102a and the second drain terminal 2022a of the second wide bandgap semiconductor power unit 202a, and a first high side of the first driving unit 101a. Further, the first high side includes a high-side power terminal 1011a and a high-side ground terminal 1012a. Referring to FIG. 1B, the first adjustment unit 103a includes a first resistor 1031a and a first Zener diode 1032a. The first Zener diode 1032a comprises its positive terminal electrically connected to the high-side ground terminal 1012a of the first driving unit 101a, and its negative terminal electrically connected to the first output node 104a. The first resistor 1301a comprises its one terminal electrically connected to the high-side power terminal 1011a of the first driving unit 101a, and its other terminal connected to the first output node 104a. Accordingly, the potential between the high-side ground terminal 1012a and the first output node 104a is provided with a shift voltage through the breakdown voltage of the first Zener diode 1032a. The shift voltage can achieve a range approximately between 5V and 10V. Thus, with respect to gate driving, the gate achieves an effect of driving by a negative voltage on the gate to source voltage (Vgs).

Again referring to FIG. 1A, similarly, a second adjustment unit 203a is disposed between the second driving unit 201a and the second wide bandgap semiconductor power unit 202a. The second adjustment unit 203a is electrically connected to, in the second wide bandgap semiconductor power unit 202a, a first ground terminal 205a electrically connected to the second source terminal 2021a, and a first low side of the second driving unit 201a. Accordingly, the intelligent power component module of the present invention is operable to be driven by a negative gate voltage, with associated principles as described above and being omitted for brevity.

Figure 1C:
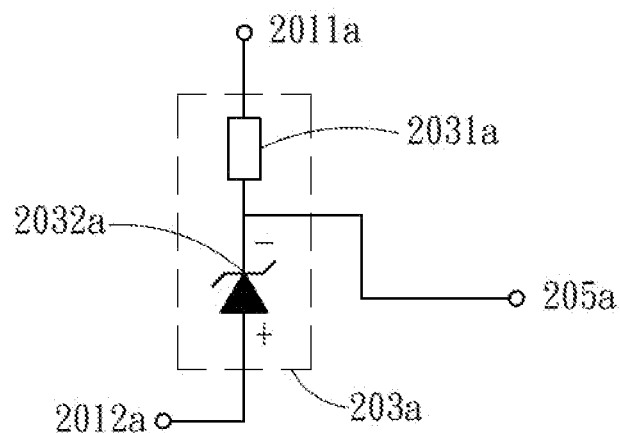
FIG. 1C is an enlarged schematic diagram of the second adjustment unit in FIG. 1A.

The first low side includes a low-side power terminal 2011a and a low-side ground terminal 2012a. Referring to FIG. 1C, the second adjustment unit 203a includes a second resistor 2031a and a second Zener diode 2032a. The second Zener diode 2032a comprises its positive terminal electrically connected to the low-side ground terminal 2012a of the second driving unit 201a, and its negative terminal electrically connected to the first ground terminal 205a. The second resistor 2031a comprises its one terminal electrically connected to the low-side power terminal 2011a of the second driving unit 201a, and its other terminal electrically connected to the first ground terminal 205a.

In one embodiment of the present invention, the first driving unit 101a, the first wide bandgap semiconductor power unit 102a, the first adjustment unit 103a, the second driving unit 201a, the second wide bandgap semiconductor power unit 202a and the second adjustment unit 203a are preferably integrated into one single package structure formed on a substrate. In another embodiment, the above components may be individually packaged based on actual requirements.

In one embodiment of the present invention, the first driving unit 101a and the second driving unit 201a are respectively formed on two chips. However, in another embodiment of the present invention, the first driving unit 101a and the second driving unit 201a may be integrated into one single driver chip. The above configuration is an example of the present invention, and the present invention is not limited thereto.

Figure 2A:
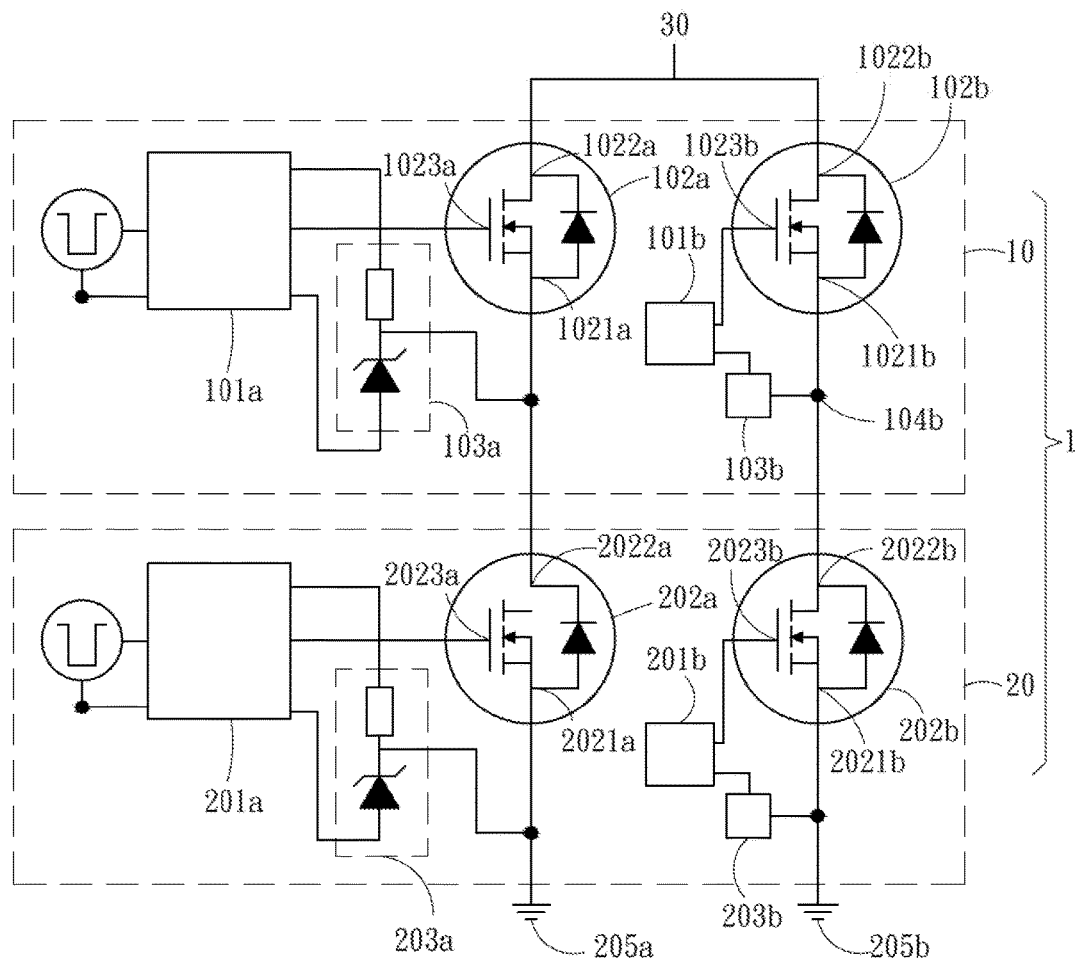
FIG. 2A a schematic diagram of an intelligent power component module operable to be driven by a negative gate voltage according to another embodiment of the present invention.

FIG. 2A shows a schematic diagram of an intelligent power component module operable to be driven by a negative gate voltage according to another embodiment of the present invention. In this embodiment, in addition to the components in FIG. 2A, the upper bridge circuit 10 further includes a third driving unit 101b, a third wide bandgap semiconductor power unit 102b and a third adjustment unit 103b. The lower bridge circuit 20 further includes a fourth driving unit 201b, a fourth wide bandgap semiconductor power unit 202b, and a fourth adjustment unit 203b.

In this embodiment, the third wide bandgap semiconductor power unit 102b comprises a third source terminal 1021b, a third drain terminal 1022b, and a third gate terminal 1023b connected to a high-side output terminal of the third driving unit 101b. The fourth wide bandgap semiconductor power unit 202b similarly comprises a fourth source terminal 2021b, a fourth drain terminal 2022b, and a fourth gate terminal 2023b connected to a low-side output terminal of the fourth driving unit 201b. Further, the fourth drain terminal 2022b is electrically connected to the third source terminal 1021b of the third wide bandgap semiconductor power unit 102b.

In this embodiment, the third adjustment unit 103b is electrically connected to a third output node 104c between the third source terminal 1021b of the third wide bandgap semiconductor power unit 102b and the fourth drain terminal 2022b of the fourth wide bandgap semiconductor power unit 202b, and a second high side of the third driving unit 101b. The fourth adjustment unit 203b is electrically connected to the fourth source terminal 2021b of the fourth wide bandgap semiconductor power unit 202b, and a second low side of the fourth driving unit 201b.

In this embodiment, the first drain terminal 1022a of the first wide bandgap semiconductor power unit 102a and the third drain terminal 1022b of the third wide bandgap semiconductor power unit 102b are both electrically connected to a direct-current (DC) bus positive terminal 30.

Figure 2B:
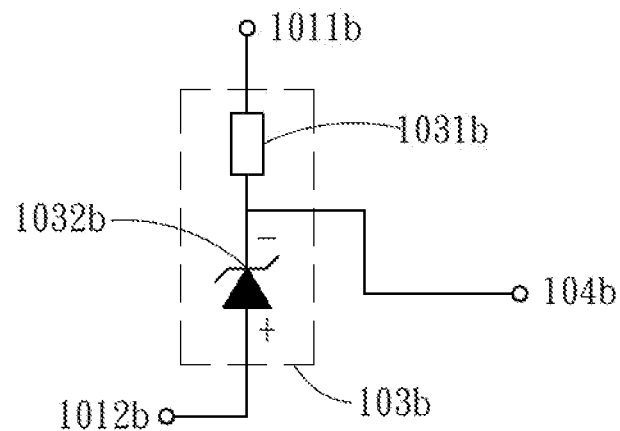
FIG. 2B is an enlarged schematic diagram of the third adjustment unit in FIG. 2A.

Referring to FIG. 2B, the second high side of the third driving unit 101b includes a high-side power terminal 1011b and a high-side ground terminal 1012b. A third Zener diode 1032b of the third adjustment unit 103b comprises its positive terminal electrically connected to the high-side ground terminal 1012b, and its negative terminal electrically connected to the second output node 104b. A third resistor 1031b of the third adjustment unit 103b comprises its one terminal electrically connected to the high-side power terminal 1011b and its other terminal electrically connected to the second output node 104b.

Figure 2C:
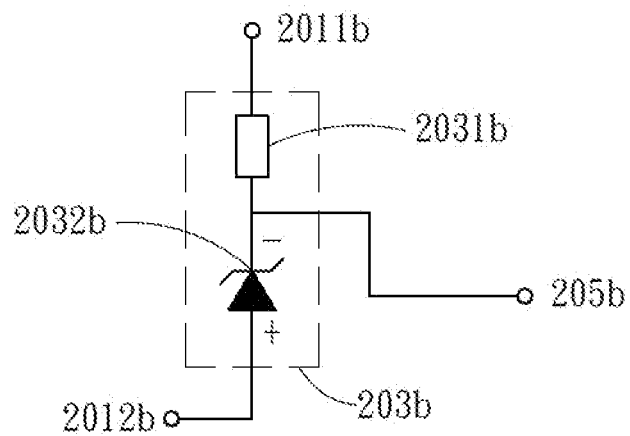
FIG. 2C is an enlarged schematic diagram of the fourth adjustment unit in FIG. 2A.

Referring to FIG. 2C, the second low side of the fourth driving unit 201b includes a low-side power terminal 2011b and a low-side ground terminal 2012b. A fourth Zener diode 2032b of the fourth adjustment unit 203b comprises its positive terminal electrically connected to the low-side ground terminal 2012b, and its negative terminal electrically connected to, in the fourth wide bandgap semiconductor power unit 202b, a second ground terminal 205b electrically connected to the fourth source terminal 2021b. A fourth resistor 2031b of the fourth adjustment unit 203b comprises its one terminal electrically connected to the low-side power terminal 2011b of the fourth driving unit 201b, and its other terminal electrically connected to the second ground terminal 205b.

Similarly, in this embodiment, the first driving unit 101a, the second driving unit 201a, the third driving unit 101b and the fourth driving unit 201b are respectively formed on different chips. However, in another embodiment, the first driving unit 101a and the third driving unit 101b may be integrated into one single driver chip, and the second driving unit 201a and the fourth driving unit 201b are integrated into another one single driver chip. Alternatively, the first driving unit 101a, the second driving unit 201a, the third driving unit 101b and the fourth driving unit 201b are integrated into the same driver chip. The above configurations are examples of the present invention, and the present invention is not limited thereto.

An intelligent power component module 1 operable to be driven by a negative gate voltage is provided according to another embodiment of the present invention, which is a three-phase bridge topology intelligent power module. In addition to the components shown in FIG. 2A, the upper bridge 10 of this embodiment further includes a fifth driving unit 101c, a fifth wide bandgap semiconductor power unit 102c and a fifth adjustment unit 103c; the lower bridge circuit 20 further includes a sixth driving unit 201c, a sixth wide bandgap semiconductor power unit 202c, and a sixth adjustment unit 203c.

In this embodiment, the fifth wide bandgap semiconductor power unit 102c comprises a fifth source terminal 1021c, a fifth drain terminal 1022c, and a fifth gate terminal 1023c connected to a high-side output control terminal of the fifth driving unit 101c. The sixth wide bandgap semiconductor power unit 202c similarly comprises a sixth source terminal 2021c, a sixth drain terminal 2022c, and a sixth gate terminal 2023c connected to a low-side output control terminal of the sixth driving unit 201c. Further, the sixth drain terminal 2022c is electrically connected to the fifth source terminal 1021c of the fifth wide bandgap semiconductor power unit 102c.

In this embodiment, the fifth adjustment unit 103c is electrically connected to a third output node 104c between the fifth source terminal 1021c of the fifth wide bandgap semiconductor power unit 102c and the sixth drain terminal 2022c of the sixth wide bandgap semiconductor power unit 202c, and a third high side of the fifth driving unit 101c. The sixth adjustment unit 203c is electrically connected to, the sixth wide bandgap semiconductor power unit 202c, a third ground terminal 205c electrically connected to the sixth source terminal 2021c, and a third low side of the sixth driving unit 201c.

Figure 3A:
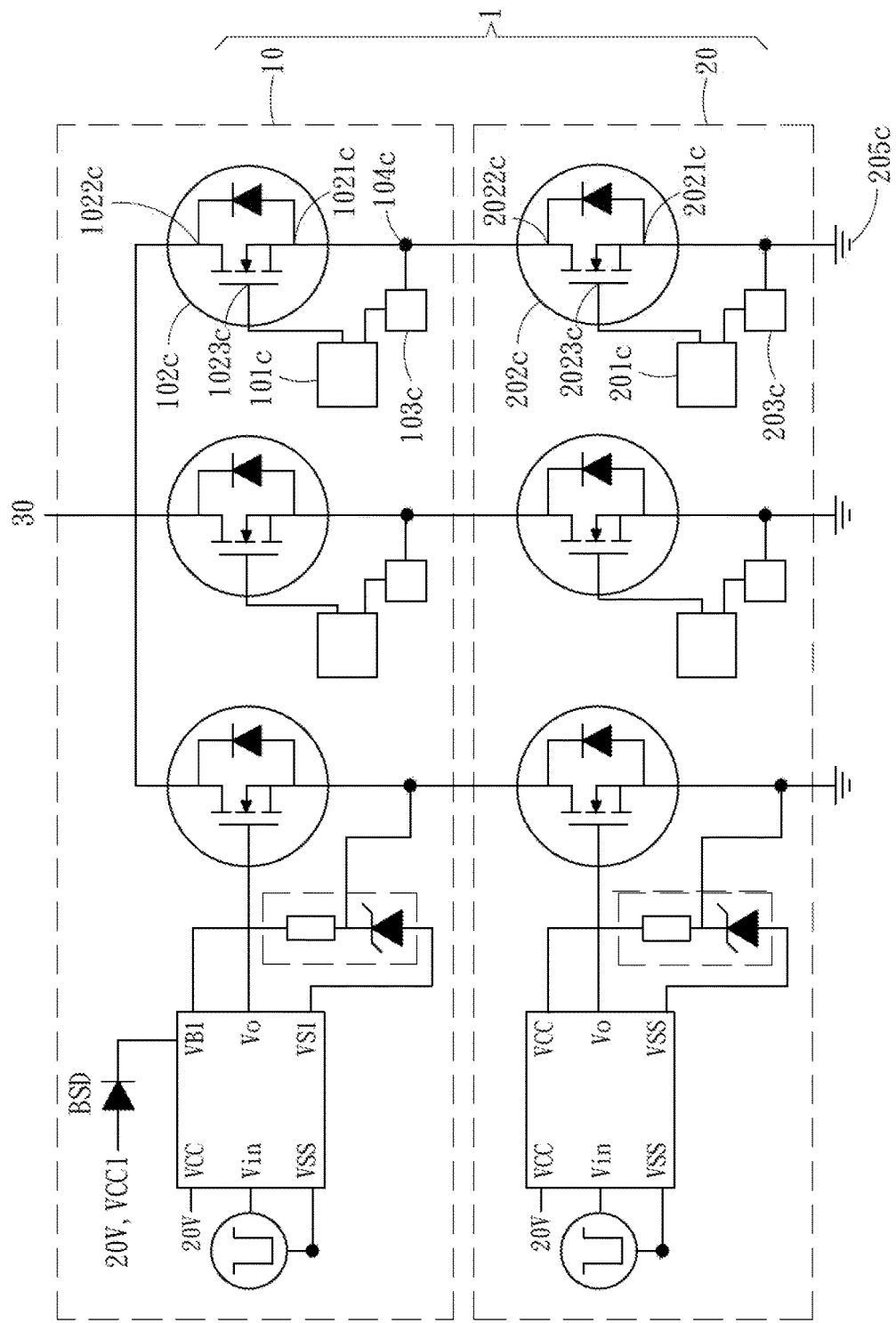
FIG. 3A is a schematic diagram of an intelligent power component module operable to be driven by a negative gate voltage according to yet another embodiment of the present invention.

Referring to FIG. 2A and FIG. 3A, in this embodiment, the first drain terminal 1022a of the first wide bandgap semiconductor power unit 102a, the third drain terminal 1022b of the third wide bandgap semiconductor power unit 102b and the fifth drain terminal 1022c of the fifth wide bandgap semiconductor power unit 102c are all electrically connected to the DC bus positive terminal 30.

Figure 3B:
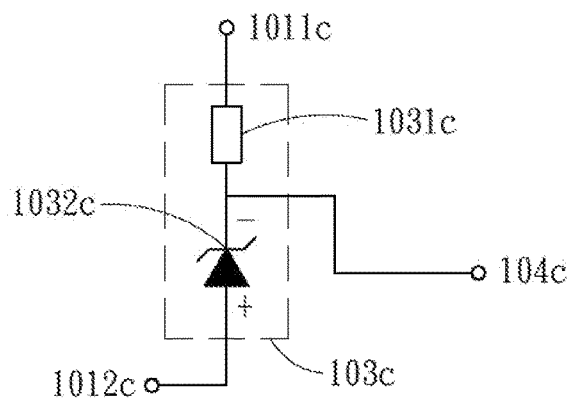
FIG. 3B is an enlarged schematic diagram of the fifth adjustment unit in FIG. 3A.

Referring to FIG. 3B, the third high side of the fifth driving unit 101c includes a high-side power terminal 1011c and a high-side ground terminal 1012c. A fifth Zener 1032 of the fifth adjustment unit 103c comprises its positive terminal electrically connected to the high-side ground terminal 1012c, and its negative terminal electrically connected to the third output node 104c. A fifth resistor 1031c of the fifth adjustment unit 103c comprises its one terminal electrically connected to the high-side power terminal 1011c of the fifth driving unit 101c and its other terminal electrically connected to the third output node 104c.

Figure 3C:
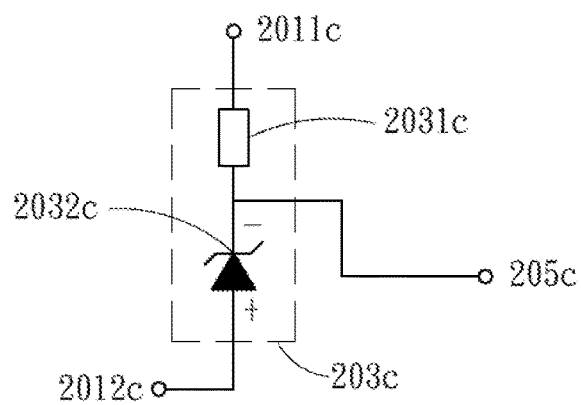
FIG. 3C is an enlarged schematic diagram of the sixth adjustment unit in FIG. 3A.

Referring to FIG. 3C, the third low side of the fifth driving unit 101c includes a low-side power terminal 2011c and a low-side ground terminal 2012c. A sixth Zener diode 2032 of the sixth adjustment unit 203c comprises its positive terminal electrically connected to the low-side ground terminal 2012c of the sixth driving unit 201c and its negative terminal electrically connected to the third ground terminal 205c. A sixth resistor 2031c of the sixth adjustment unit 203c comprises its one terminal electrically connected to the low-side power terminal 2011c and its other terminal electrically connected to the third ground terminal 205c.

Similarly, referring to FIG. 1A, FIG. 2A and FIG. 3A, in this embodiment, the first driving unit 101a, the second driving unit 201a, the third driving unit 101b, the fourth driving unit 201b, the fifth driving unit 101c and the sixth driving unit 201c are respectively formed on different chips. However, in another embodiment of the present invention, the first driving unit 101a and the second driving unit 201a are integrated into one single driver chip, the third driving unit 101b and the fourth driving unit 201b are integrated into another one single driver chip, and the fifth driving unit 101c and the sixth driving unit 201c are integrated into yet another single driver chip. Alternatively, the first driving unit 101a, the second driving unit 201a, the third driving unit 101b, the fourth driving unit 201b, the fifth driving unit 101c and the sixth driving unit 201c are integrated into the same driver chip. The above configurations are examples of the present invention, and the present invention is not limited thereto.

In the present invention, the wide bandgap semiconductor power units 102a, 102b, 102c, 202a, 202b and 202c may identical or different, and are selected from a metal-oxide semiconductor field-effect transistor (MOSFET), a junction field-effect transistor (JFET), a high electron mobility transistor (HEMT) or an insulated gate bipolar transistor (IGBT). In this embodiment, these wide bandgap semiconductor power units 102a, 102b, 102c, 202a, 202b and 202c are all SiC MOSFETs to form an all-SiC intelligent power module, which not only effectively reduces switching loss but also provides a smaller amount of heat dissipation.

Figure 4:
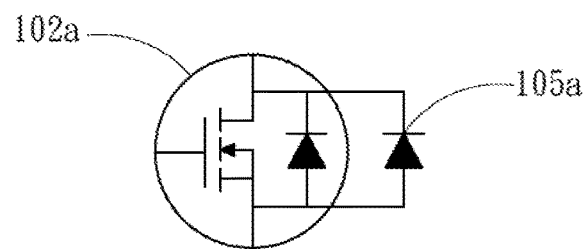
FIG. 4 is a schematic diagram of a first wide bandgap semiconductor power unit according to an embodiment of the present invention.

In another embodiment, to achieve even lower power consumption, in addition to the SiC MOSFET mentioned above, the wide bandgap semiconductor power unit may further include a SiC freewheeling diode (FWD) 105a connected in parallel with the SiC MOSFET, as shown in FIG. 4. The turn-on voltage of the SiC FWD 105a is lower compared to a built-in body diode 105b (referring to FIG. 1) of the SiC MOSFET, and is capable of conducting current fed back from an inductive load when the intelligent power component module 1 operable to be driven by a negative gate voltage is in operation, providing even lower power loss.

Accordingly, respective voltage levels of the driving units 101a, 101b, 101c, 201a, 201b and 201c are respectively provided with shift voltages by the adjustment units 103a, 103b, 103c, 203a, 203b and 203c and are thus adjusted. As such, each of the wide bandgap semiconductor power units 102a, 102b, 102c, 202a, 202b and 202c, in a driver state, is provided with driving voltage level alternating between a positive voltage and a negative voltage of between 20V and −10V.

Figure 5A:
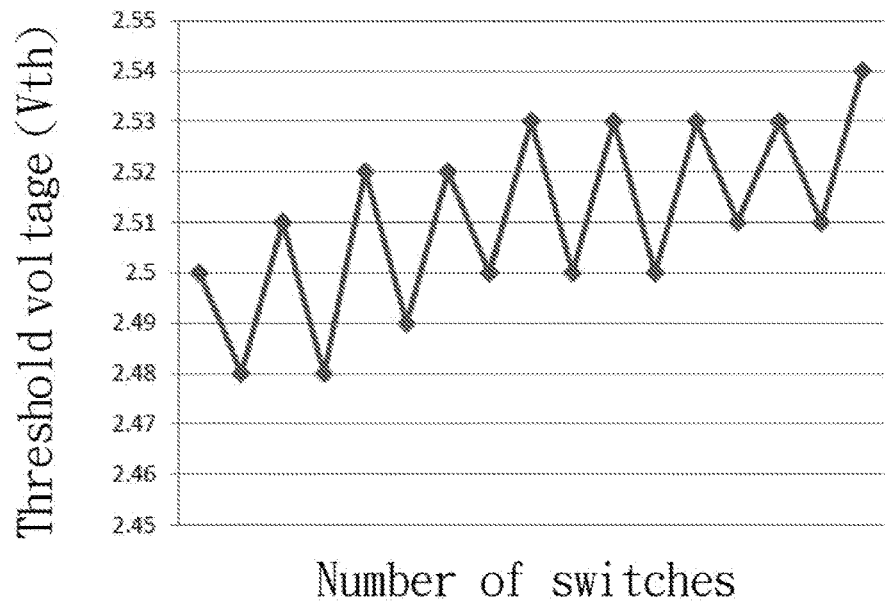
FIG. 5A shows experimental results of the influence that a driving voltage level without alternating positive and negative voltages comprises on the stability of a threshold voltage.
Figure 5B:
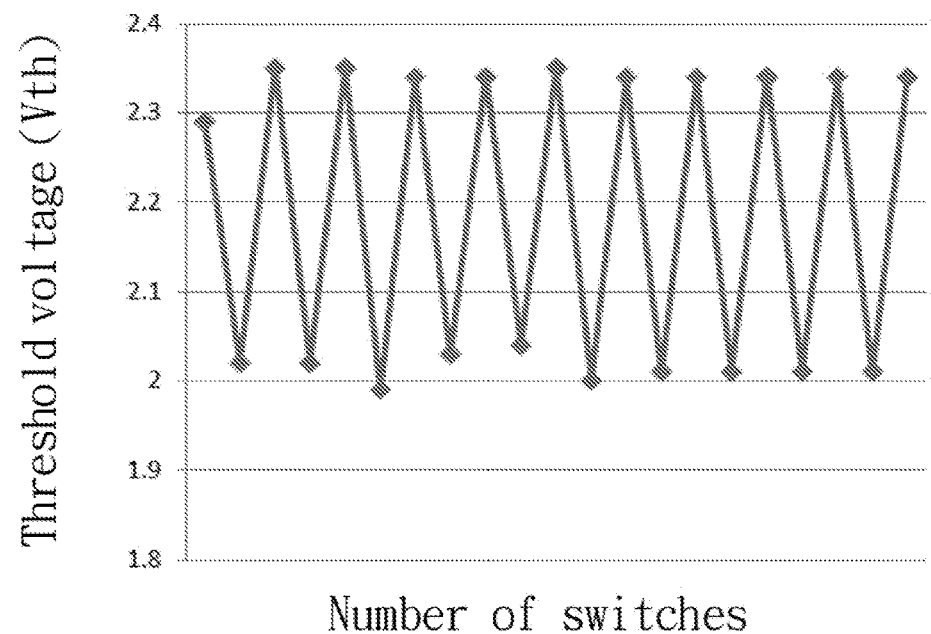
FIG. 5B shows experimental results of the influence that a driving voltage level with alternating positive and negative voltages comprises on the stability of a threshold voltage.

FIG. 5A and FIG. 5B show experimental results of influences of driving voltage levels without and with alternating positive and negative voltages on the stability of the threshold voltage. In FIG. 5A, the driving voltage level is between 0V and 20V, and the threshold voltage (Vth) is unstable during the operation process; when the driving voltage level is between −5V and 20V, the threshold voltage stays stable during the operation process, as shown in FIG. 5B, and so the reliability of the intelligent power component module is enhanced.

Therefore, compared to the prior art, the intelligent power component module of the present invention provides following features.

1. The intelligent power component module of the present invention is an intelligent power component module operable to be driven by a negative gate voltage, hence overcomes the issue that a positive bias threshold and a negative bias threshold of the module become unstable due to defects at an interface of a SiC wide bandgap semiconductor unit when the SiC wide bandgap semiconductor power unit is used in a conventional intelligent power module, thereby enhancing the reliability of the intelligent power component module.

2. The intelligent power component module of the present invention is applicable in coordination with a common gate driver for silicon insulated gate bipolar transistor rather than needing an exclusive gate driver, thereby significantly reducing production costs of the intelligent power component module to promote industrial application.

3. In the intelligent power component module of the present invention, components are internally connected and integrated in one single package structure. Thus, with respect to the external of the intelligent power component module, pin-to-pin compatibility is provided to allow the intelligent power component module of the present invention to be extensively applied to replace other conventional intelligent power component module products.

What is claimed is:

1. An intelligent power component module operable to be driven by a negative gate voltage, comprising:
 an upper bridge circuit, comprising a first driving unit and a first wide bandgap semiconductor power unit electrically connected to the first driving unit, the first wide bandgap semiconductor power unit having a first drain terminal, a first gate terminal and a first source terminal;
 a lower bridge circuit, comprising a second driving unit and a second wide bandgap semiconductor power unit electrically connected to the second driving unit, the second wide bandgap semiconductor power unit having a second drain terminal electrically connected to the first source terminal of the first wide bandgap semiconductor power unit, a second gate terminal and a second source terminal;

a first adjustment unit, comprising a first resistor electrically connected to the first driving unit and a first Zener diode electrically connected to the first resistor, the first Zener diode electrically connected to a first output node between the first source terminal of the first wide bandgap semiconductor unit and the second drain terminal of the second wide bandgap semiconductor power unit, and a first high side of the first driving unit; and a second adjustment unit, comprising a second resistor electrically connected to the second driving unit and a second Zener diode, the second Zener diode electrically connected to the second source terminal of the second wide bandgap semiconductor power unit and a first low side of the second driving unit;

wherein, voltage levels of the first driving unit and the second driving unit are provided with respective shift voltages by the first adjustment unit and the second adjustment unit and are adjusted, such that the first wide bandgap semiconductor power unit and the second wide bandgap semiconductor power unit, in a driven state, is each provided with a driving voltage level alternating between a positive voltage and a negative voltage.

2. The intelligent power component module of claim 1, wherein the first wide bandgap semiconductor power unit and the second wide bandgap semiconductor power unit are at least one selected independently from a group consisting of a metal-oxide semiconductor field-effect transistor (MOSFET), a junction field-effect transistor (JFET), a high electron mobility transistor (HEMT), and an insulated gate bipolar transistor (IGBT).

3. The intelligent power component module of claim 1, wherein the first driving unit and the second driving unit are integrated into one single driving unit.

4. The intelligent power component module of claim 1, wherein the first adjustment unit is electrically connected to a high-side ground terminal and a high-side power terminal of the first driving unit, and the second adjustment unit is electrically connected to a low-side ground terminal and a low-side power terminal of the second driving unit.

5. The intelligent power component module of claim 4, wherein the second wide bandgap semiconductor power unit comprises a first ground terminal electrically connected to the second source terminal, the first Zener diode comprises a negative terminal thereof electrically connected to the first output node and a positive terminal thereof electrically connected to the high-side ground terminal, and the second Zener diode comprises a negative terminal thereof electrically connected to the first ground terminal and a positive terminal thereof electrically connected to the low-side ground terminal.

6. The intelligent power component module of claim 1, wherein:
the upper bridge circuit further comprises:
a third driving unit;
a third wide bandgap semiconductor power unit, electrically connected to the third driving unit, having a third source terminal and a third drain terminal electrically connected to the third source terminal; and
a third adjusting unit, electrically connected to the third wide bandgap semiconductor power unit and the third driving unit, comprising a third resistor electrically connected to the third driving unit and a third Zener diode electrically connected to the third resistor; and
the lower bridge circuit further comprises:
a fourth driving unit;
a fourth wide bandgap semiconductor power unit, electrically connected to the fourth driving unit, having a fourth source terminal and a fourth drain terminal electrically connected to the fourth source terminal and the third source terminal of the third wide bandgap semiconductor power unit; and
a fourth adjustment unit, electrically connected to the fourth source terminal of the fourth wide bandgap semiconductor power unit and the fourth driving unit, comprising a fourth resistor electrically connected to the fourth driving unit and a fourth Zener diode electrically connected to the fourth resistor;
wherein, the first drain terminal of the first wide bandgap semiconductor power unit and the third drain terminal of the third wide bandgap semiconductor power unit are both electrically connected to a direct-current (DC) bus positive terminal.

7. The intelligent power component module of claim 6, wherein: the upper bridge circuit further comprises:
a fifth driving unit;
a fifth wide bandgap semiconductor power unit, electrically connected to the fifth driving unit, having a fifth source terminal and a fifth drain terminal electrically connected to the fifth source terminal; and
a fifth adjusting unit, electrically connected to the fifth wide bandgap semiconductor power unit and the fifth driving unit, comprising a fifth resistor electrically connected to the fifth driving unit and a fifth Zener diode electrically connected to the fifth resistor;
the lower bridge circuit further comprises:
a sixth driving unit;
a sixth wide bandgap semiconductor power unit, electrically connected to the sixth driving unit, having a sixth source terminal and a sixth drain terminal electrically connected to the sixth source terminal and the fifth source terminal of the fifth wide bandgap semiconductor power unit; and
a sixth adjustment unit, electrically connected to the sixth source terminal of the sixth wide bandgap semiconductor power unit and the sixth driving unit, comprising a sixth resistor electrically connected to the sixth driving unit and a sixth Zener diode electrically connected to the sixth resistor;
wherein, the third drain terminal of the third wide bandgap semiconductor power unit and the fifth drain terminal of the fifth wide bandgap semiconductor power unit are both electrically connected to the DC bus positive terminal.

8. The intelligent power component module of claim 1, wherein the first wide bandgap semiconductor power unit and the second wide bandgap semiconductor power unit are both a silicon carbide (SiC) metal-oxide semiconductor field-effect transistor (MOSFET).

9. The intelligent power component module of claim 8, wherein the SiC MOSFET further comprises a freewheeling diode (FWD) connected in parallel to the SiC MOSFET.

10. The intelligent power component module of claim 1, wherein the first driving unit, the first wide bandgap semiconductor power unit, the first adjusting unit, the second driving unit, the second wide bandgap semiconductor power unit and the second adjustment unit are integrated into one single package structure.

11. The intelligent power component module of claim 1, wherein the first wide bandgap semiconductor unit is connected to the first driving unit via the first gate terminal, and the second wide bandgap semiconductor unit is connected to the second driving unit via the second gate terminal.

12. The intelligent power component module of claim 1, wherein the driving voltage level alternating between the positive voltage and the negative voltage is between 20V and −10V.

\* \* \* \* \*